USOO5206815A

United States Patent [19]
Purcell

[11] Patent Number: 5,206,815
[45] Date of Patent: Apr. 27, 1993

[54] METHOD FOR ARRANGING MODULES IN AN INTEGRATED CIRCUIT

[75] Inventor: Shawn M. Purcell, Mountain View, Calif.

[73] Assignee: VLSI Technology, Inc., San Jose, Calif.

[21] Appl. No.: 297,476

[22] Filed: Jan. 13, 1989

[51] Int. Cl.5 .............................................. G06F 15/60
[52] U.S. Cl. .................................. 364/491; 364/490; 364/489; 364/488
[58] Field of Search ................ 364/488, 489, 490, 491

[56] References Cited

U.S. PATENT DOCUMENTS

| 4,686,629 | 8/1987 | Noto et al. | 364/491 |
|---|---|---|---|
| 4,777,606 | 10/1988 | Fournier | 364/491 |
| 4,815,003 | 3/1989 | Putatunda et al. | 364/491 |
| 4,858,143 | 8/1989 | Fournier | 364/489 |
| 4,931,946 | 6/1990 | Ravindra et al. | 364/490 |

OTHER PUBLICATIONS

"A dense Gate Matrix Layout Method for MOS VLSI" by A. D. Lopez et al., IEEE trans Electron Devices, vol. ED-27, pp. 1671-1675, Aug. 1980.

*Primary Examiner*—Vincent N. Trans
*Attorney, Agent, or Firm*—Burns, Doane, Swecker & Mathis

[57] ABSTRACT

A method for generating a layout of a rectangular block of cells for use with other rectangular blocks of cells in an integrated circuit. In the preferred embodiment, the method includes the steps of providing a set of component circuit cells, each of the cells being of generally rectangular shape with predefined dimensions and, then, concatenating the component cells with at least one expandable cell space between non-abutting adjacent edges of at least two of the elements such that the boundary of the concatenated set defines a block of cells having a generally rectangular shape which is coterminous with a second, predefined generally rectangular block of cells.

7 Claims, 6 Drawing Sheets

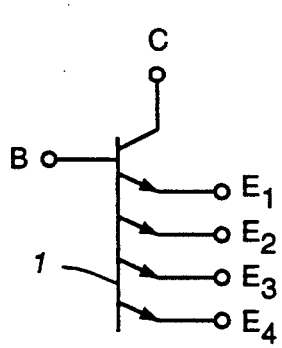
FIG._1A
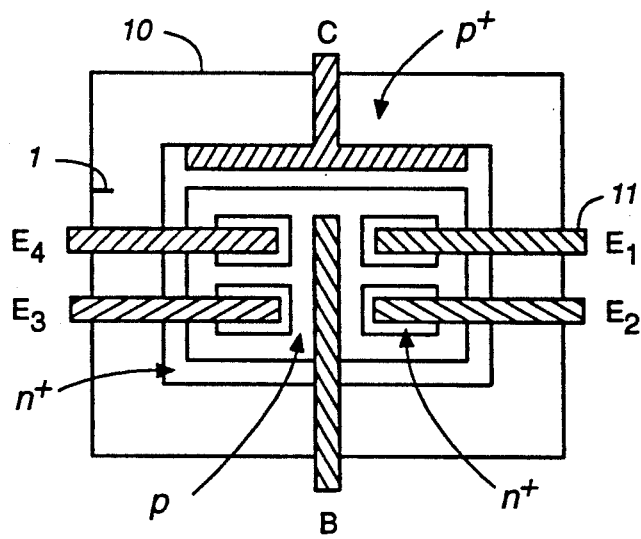
FIG._1B
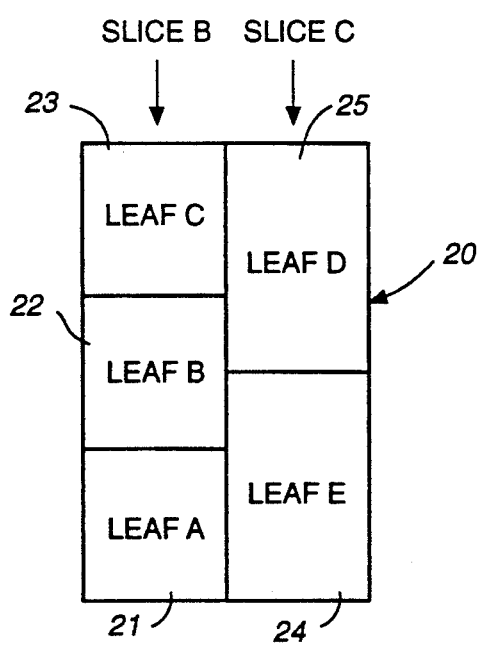
FIG._2
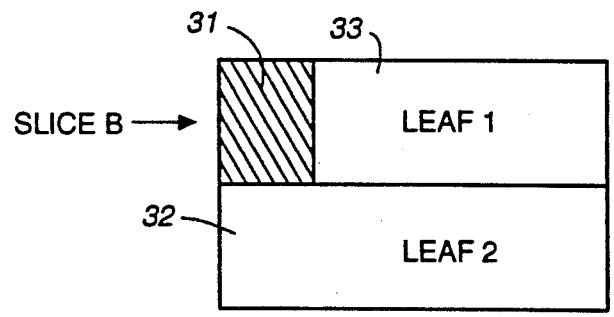
FIG._3
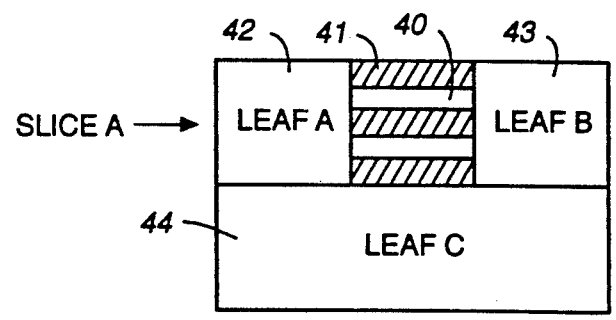
FIG._4

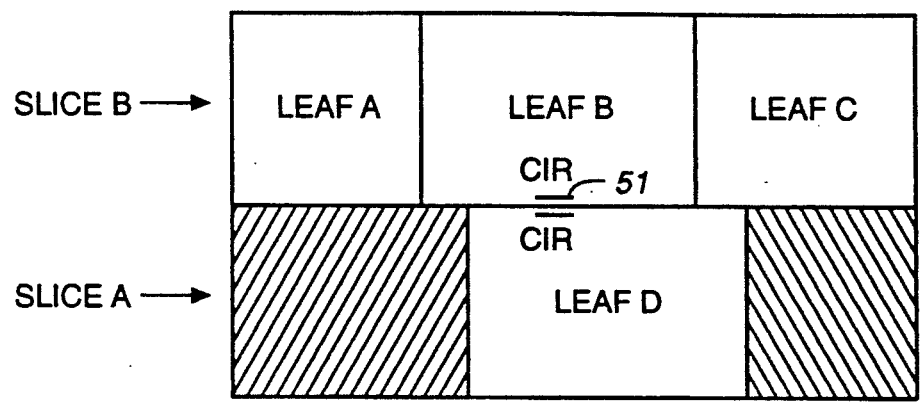
FIG._5
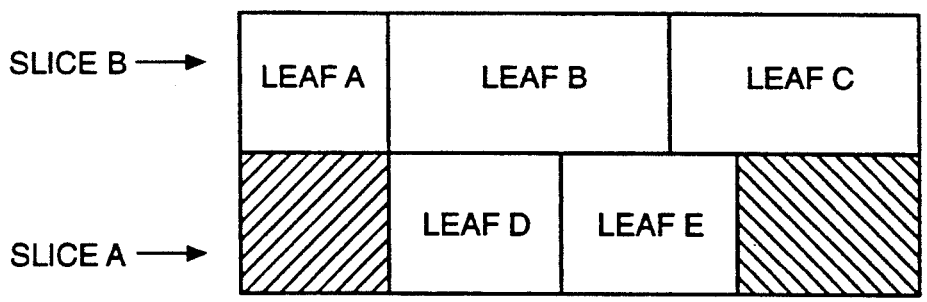
FIG._6
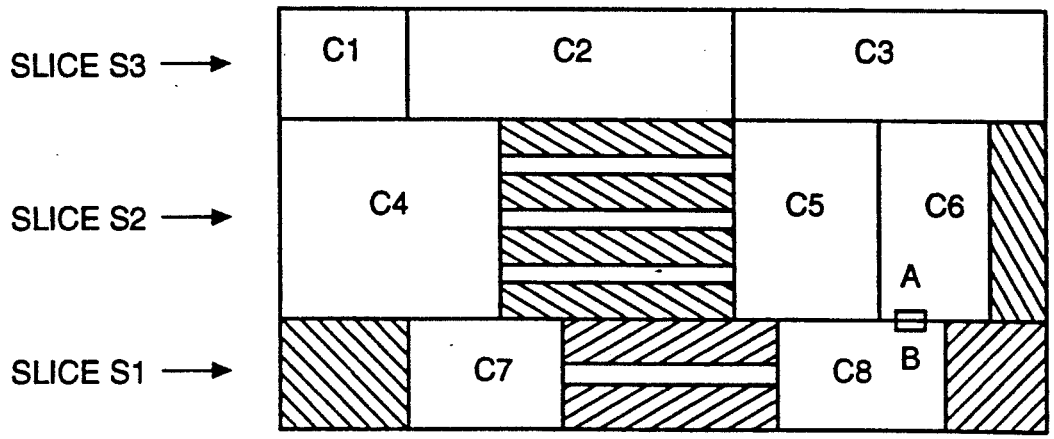
FIG._7

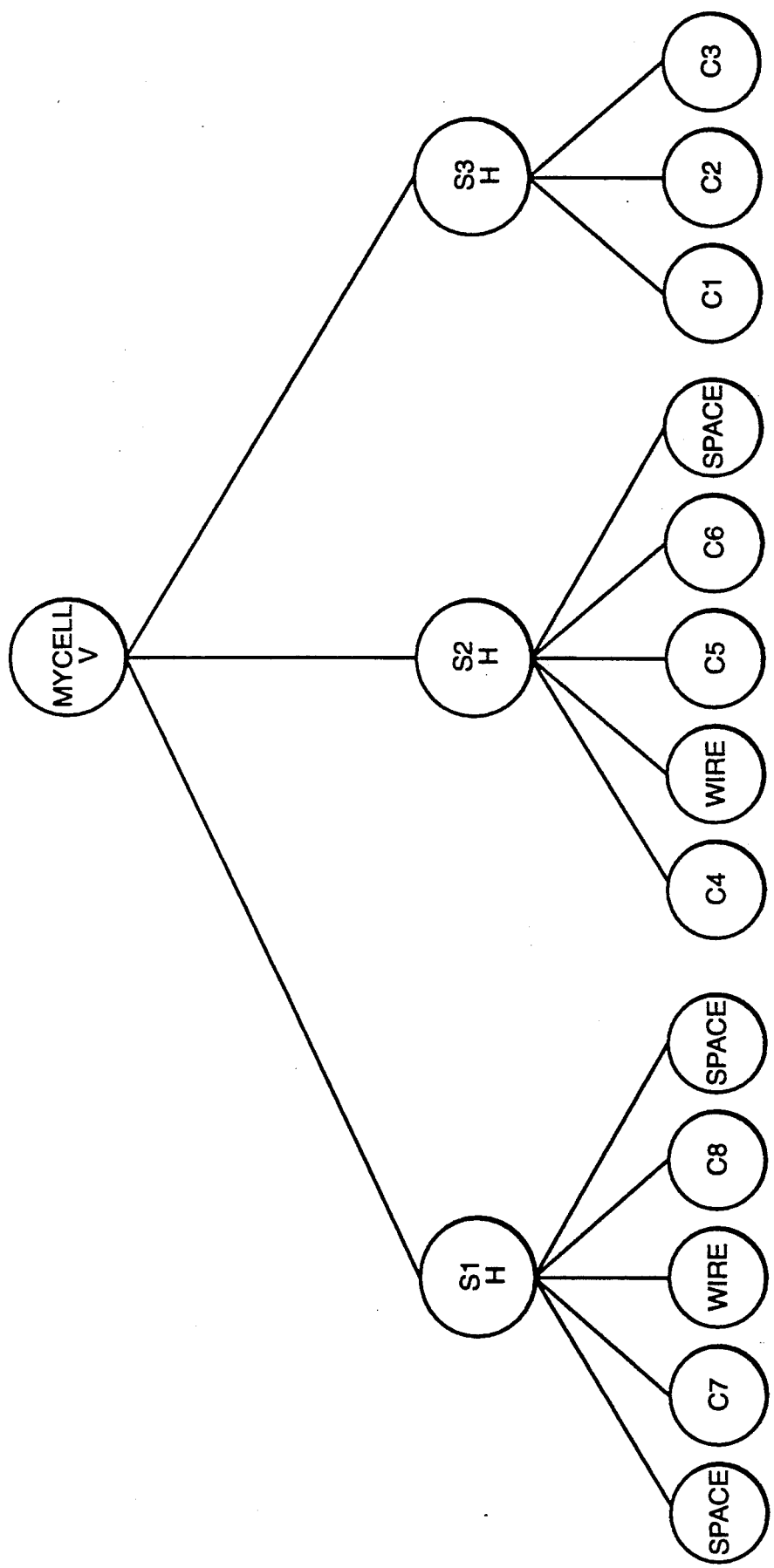
FIG._8

METHOD FOR ARRANGING MODULES IN AN INTEGRATED CIRCUIT

BACKGROUND OF THE INVENTION

1. Field of the Invention

The present invention generally relates to integrated circuits and, more particularly, to a method for laying-out designs of large scale and very large scale integrated circuits.

2. State of the Art

Integrated circuit modules can either be custom designed or can be designed by using a module generation technique such as a slice composition model. Although custom designs of integrated circuits often result in highly efficient use of silicon substrates, such designs are costly and time-consuming in terms of engineering.

In the art of designing integrated circuits, it is known that the slice composition method is particularly useful for laying out designs of integrated circuits which repeatedly use similar or identical circuit modules. Some examples of integrated circuits which are often designed by the slice composition technique are read only memories (ROM's), random access memories (RAM's), and programmable logic arrays (PLA's), and their use in application specific integrated circuits (ASIC's).

In the slice composition technique, frequently-used elements, or "cells," are often referred to as "tiles" or "leaves". The modular component cells are known as tiles because, by analogy to mosaic patterns formed of ceramic tiles, they can be placed adjacent to one another to form larger patterns. The modular cells are also known as leafs because, by analogy to the leafs of a tree, they form the lowest component in a hierarchy. For present purposes, patterns formed of modular cells will be called "blocks". And it should be understood that a block composed of a group of cells may be used as a module in a larger block.) Since individual types of cells are often used repetitively in a circuit design, the particular occurrence of a cell is called an "instance".

In conventional procedural layout methods, the spatial orientation of each cell must be designated by its specific cartesian coordinates. That is, conventional procedural layout methods require a detailed specification of the spatial orientation of cells. According to such conventional methods, once cells are positioned, they are interconnected. Thus, one drawback of such methods is that misplacements of cells or their routing lines can result in faulty operation of the resulting integrated circuit, even though the misplacements are barely perceptible to a circuit design engineer.

Typically, different types of modular cells are not uniform in size and therefore, do not fit together without some spatial adjustments. That is, when different types of cells are compiled to form a block, the ports of the cells will usually not be in alignment nor will the sides of the cells uniformly abut. To overcome this latter difficulty, it is known to employ a technique, known as composition wherein cells are stretchable; that is, according to this technique the size of the cells is expanded or shrunk as required to fill the area of interest in an integrated circuit. The main drawback of such methods is that they do not efficiently utilize space on a silicon substrate.

SUMMARY OF THE INVENTION

A method for generating a layout of a rectangular block of cells for use with other rectangular blocks of cells in an integrated circuit. In the preferred embodiment, the method comprises the steps of providing a set of component circuit cells, each of the cells being of generally rectangular shape with predefined dimensions and, then, concatenating the component cells with at least one expandable cell space between non-abutting adjacent edges of at least two of the elements such that the boundary of the concatenated set defines a block of cells having a generally rectangular shape which is coterminous with a second, predefined generally rectangular block of cells.

BRIEF DESCRIPTION OF THE DRAWINGS

The present invention may be more fully understood by considering the following detailed description in conjunction with the drawings, in which;

FIGS. 1(a) and 1(b) depict a typical transistor;

FIG. 2 depicts a block formed by two slices, each slice composed of a number of cells;

FIG. 3 depicts a block including a stretchable white space cell;

FIG. 4 depicts a circuit block including a stretchable wire routing cell;

FIG. 5 depicts a circuit block composed of cells having input and output ports to be aligned;

FIGS. 6 and 7 depict other examples of circuit blocks comprising of cells;

FIG. 8 depicts a slice tree, or hierarchy, for use in structuring an integrated circuit

DETAILED DESCRIPTION OF THE PREFERRED EMBODIMENT

Figure 9A:
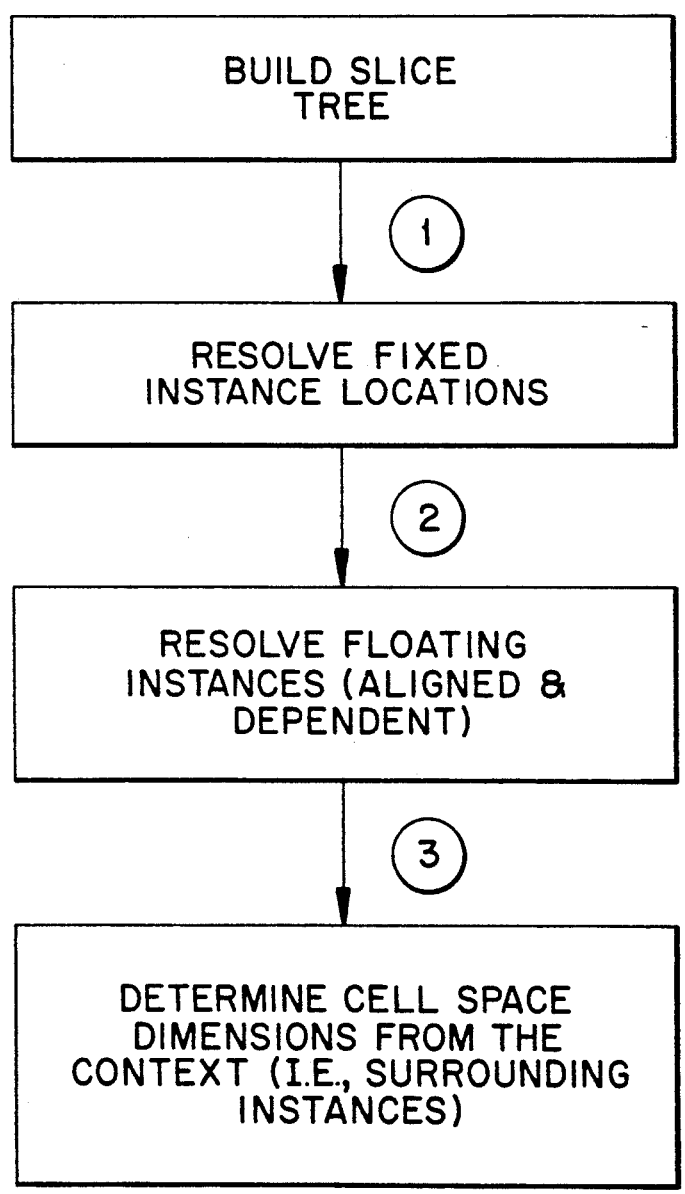
FIGS. 9A–9C illustrate an exemplary flow chart associated with operation of the aforementioned exemplary embodiments of the invention.

In accordance with the preceding discussion, FIG. 1a depicts the electrical schematic of a multiple emitter transistor 1, and FIG. 1b depicts a cell comprises of the transistor's monolithic surface pattern. The outer rectilinear boundary of the cell is designated by numeral 10. The emitters, collector and base of the transistor comprise the ports 11 of the cell. One can understand that a plurality of such leafs can be interconnected via their ports 11 to form larger circuit components (i.e., blocks).

In the art of integrated circuit design, it is known to define the composition of a block of cells by one or more slices, such as the slices b and c shown in FIG. 2. More particularly a vertical slice, or "VERT", is formed by concatenating a number of blocks of the same width to form a vertical column. Similarly a horizontal slice, or "HORIZ", is formed by concatenating a number of blocks of the same height to form a horizontal row.

The cell depicted in FIG. 2, for example, can be defined by the following algorithm:

```
BLOCK a:
    a := HORIZ b c;
    b := VERT leafa leafb leafc;
    c := VERT leafd leafe;
CELLEND.
```

In the preceding algorithm, the first line defines the cell by name "a". In the second line, cell "a" is described as a horizontal slice comprised of horizontally contiguous slices b and c, each having the same height. In the third line of the algorithm, slice "b" is described as a vertical slice comprised of leafa 21, leafb 22 and leafc 23, each having the same width. Finally, slice c is defined as a vertical slice comprised of vertically contiguous leafs 24 and 25, each having the same width.

In FIG. 2, the sum of heights of the cells comprising vertical slices b and c are equal. Since the horizontal concatenation of these two vertical slices forms a rectangular block, the resultant module can, in turn, form a cell in a larger design. It should be noted that each of the cells has a fixed size; that is, the cells are not stretchable.

In practice, situations often arise where two or more concatenated cells have dimensions such that their continuous combination do not form a rectangular block. In accordance with the present invention, those cases are handled by adding one or more "white space" cells to the concatenation so that the resultant combination is a rectangular block. An example of a simple block containing a stretchable white space 31 is shown in FIG. 3.

In FIG. 3 the white space 31 in cell "d" can be represented by the following algorithm:

```
BLOCK d:
    a   VERT leaf2 b;
    b   HORIZ SPACE leaf1;
CELLEND.
```

Thus, the preceding algorithm stretches white space 31 to make slice b and leaf2 32 to be the same width. (The height of white space 31 is determined from the context.)

FIG. 4 shows a cell "g" containing a white space 41. In this embodiment wires 40 extend through the white space 41 to connect two ports of leafa with two ports of leafb. The following algorithm defines the cell:

```
BLOCK g:
    g   VERT leafc a;
    a   HORIZ leafa WIRE (C) leafb;
CELLEND.
```

The operator represented by the symbol "C" in the preceding algorithm specifies that all of the ports of leafa 42 are connected to the ports of leafb 43 by wires 40. To provide a resultant block which has a rectangular configuration, the left side of leafa 42 is aligned with the left side of leafc 44 (since they are both the left instances of contiguous slices) and the right of leafb 43 is aligned with the right side of leafc 4 (since they are both right instances of contiguous slices).

FIG. 5 shows an example of a cell "h" with white spaces on opposite sides of the axis of a slice. The cell "h" in FIG. 5 can be defined by the following algorithm:

```
BLOCK h:
    h   VERT a b;
    a   HORIZ SPACE leafd (ALIGN clr il.clr) SPACE;
    b   HORIZ leafa leafb(il) leafc;
CELLEND.
```

The name in parenthesis after the leaf name (e.g., il above) is an instance name and is provided when the instance is to be referred to later in the algorithm. The abbreviation "clr" is the name of a port.

Further according to the present invention, several fixed instances can be located between two white SPACES. Such a situation is shown in FIG. 6. The block "j" in FIG. 6 can be defined by the following algorithm:

```
BLOCK j:
    j   VERT a b;
    a   HORIZ SPACE leafd(ALIGN NW il.SW) leafe SPACE;
    b   HORIZ leafa leafb(il) leafc;
CELLEND.
```

The preceding algorithm illustrates the use of corner names NW and SW. Use of those corner names, along with SE and NE, allows alignments based upon the corners of the cells.

The above-described examples are cumulated in FIG. 7 to illustrate an alignment algorithm for determining the position of all instances in a block "k". In accordance with the above-discussed procedures, the block "k" of FIG. 7 can be defined by the following algorithm:

```
BLOCK k:
    k   VERT s1 s2 s3;
    s1  HORIZ SPACE c7(ALIGN NW c2.SW WIRE(C)
        c8(ALIGN b c6.a) SPACE;
    s2  HORIZ c4 WIRE(c) c5(ALIGN NW c3.SW) c6 SPACE;
    s3  HORIZ c1 c2 c3;
CELLEND.
```

FIG. 8 shows a slice tree with cells (e.g. SPACE, WIRE, c1–c8), and with slices (HORIZ or VERT) as internal nodes s1–s3. It should be noted that the tree of FIG. 8 corresponds to the circuit layout depicted in FIG. 7.

As previously mentioned, the cells, or leafs, of a slice tree have fixed size except for white space cells. If any of the blocks in a HORIZ are stretchable in the x-dimension, (i.e., a white space cell or wire cell), then the HORIZ as a whole is stretchable in the x-dimension. Otherwise the width of HORIZ is simply the sum of the widths of the cells from which it is composed. Likewise, the calculation of the height of slices s1, s2 and s3 in the example above is simply the height of the fixed cells in each. The width of slice s3 is the sum of the widths of leafs c1, c2 and c3. A fixed instance is one that does not depend on alignment with another leaf. The fixed instances in the preceding example are c1, c2, c3 and c4. For all of the fixed instances of a leaf, coordinates are assigned relative to the lower left corner of the cell.

Instances that have explicit alignment in a block are called aligned instances. Leafs c5, c7 and c8 are aligned instances in the preceding example. Finally, an instance that does not have an alignment by itself, but depends on an instance that does, is called a dependent instance. In the example, instance c6 is a dependent instance since its location depends on the location of aligned instance c5.

To resolve the location of the fixed instances, a depth-first traversal of the slice tree is performed. Within a slice, the traversal goes from left to right (HORIZ), and from bottom to top (VERT). Typically, variables for defining the current x and y positions are designated, both of which are initialized to zero. Then, going from one leaf to the next of a HORIZ slice, the width of the last instance is added to the current value of x. Similarly, going from one leaf to the next leaf in a VERT slice, the current value of y is added to the height of the last instance.

If an instance is an aligned instance, it is necessary to find the instance to which it is aligned, and determine the position of that instance (using the method described here, and depending on whether it in turn is a fixed instance, an aligned instance, or a dependent instance). Using that position, the specified points on the two instances are aligned, which provides the position of the aligned instance in question. If an instance is a dependent instance, it is necessary to locate the instance on which it is dependent, and then to abut the dependent instance adjacent to the located instance.

Figure 9B:
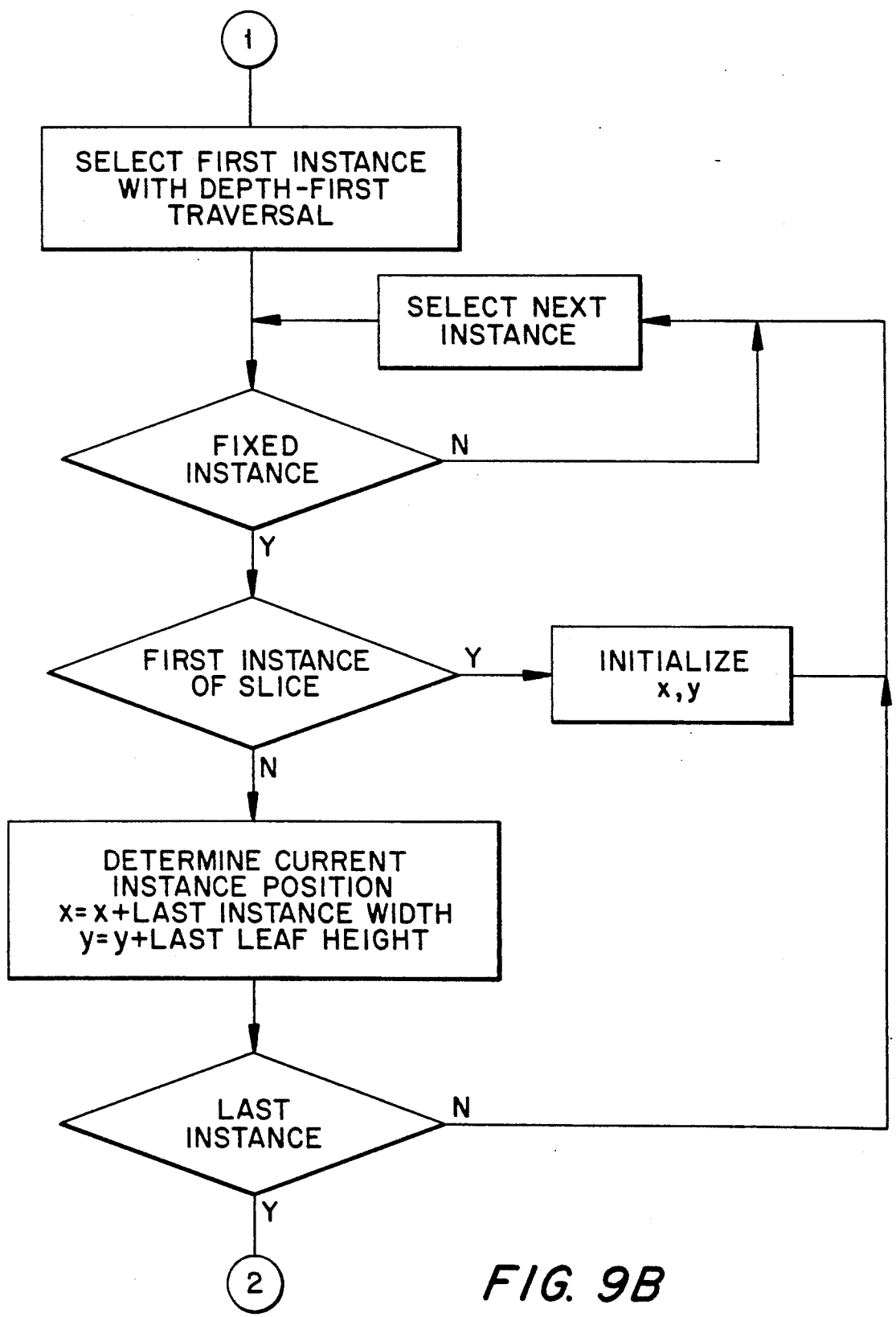
Figure 9C:
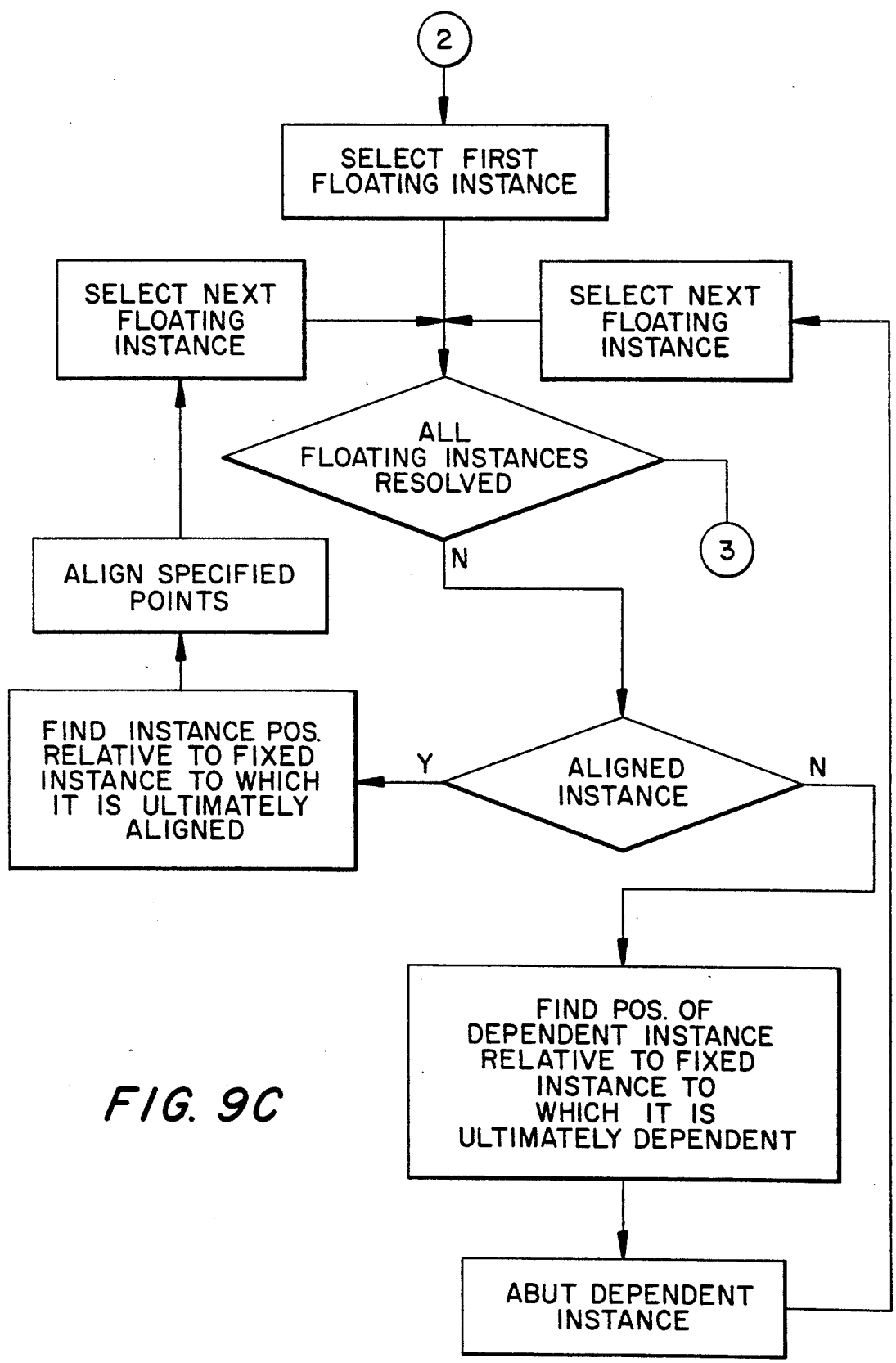

A procedure for locating the positions the floating instances c7, c8, c6 and c5 of FIG. 7 will now be explained. Because the location of instance c7 is dependent on fixed instance c2, its position is determined by position of instance c2. Then, the left side of instance c7 is aligned with the left side of leaf c2, thereby resolving the location of instance c7. Similarly, instance c8 is aligned with instance c6, which, in turn, is dependent on the position of instance c5, which itself is aligned with instance c3 which is a fixed instance. Likewise, the position of instance c5, and the location of instance c6 can be resolved by taking the x- coordinate of c5 plus the width of c5 to determine the x- coordinate c6. Finally, leaf c6 can be used to align leaf c8 such that the b connector of leaf c8 aligns with the connector of leaf c6, thereby determining the position of instance c8. FIG. 9A represents a flow chart of an exemplary operation of embodiments as described above with respect to FIGS. 1–8. FIGS. 9B and 9C illustrate, in greater detail, those portions of the FIG. 9A flow chart which relate to resolving fixed instance locations and resolving floating instances, respectively as described above.

It can now be understood that the method of the present invention, by relating the spatial orientation of component cells to one another and providing expandable white cells (or wire routing cells) between adjacent but non-abutting cells, provides improved wireability, reliability, and ease of design of integrated circuits. Further, the method can improve silicon space utilization. Also, the above-described method eliminates the need to specify coordinate data or dimensions for each and every cell or space in an integrated circuit module. Thus, the method reduces design errors including inadvertent overlaps or unexpected gaps between cells in an integrated circuit.

Although the present invention has been described above in specific terms, the description should be regarded as illustrative rather than limitative. Thus, workers of ordinary skill in the art will appreciate that the invention may be otherwise practiced, but that such alternative modes are encompassed by the terms of the following claims and equivalents thereto.

What is claimed is:

1. A method for generating a layout of a rectangular block of cells for use with a second rectangular block of cells in an integrated circuit, comprising the steps of:
   a) providing a set of component circuit cells, each of the cells being of generally rectangular shape with predefined dimensions;
   b) concatenating the component cells with at least one space cell that is expandable between non-abutting adjacent edges of at least two of the component cells such that the boundary of a concatenated set of component cells and at least one expandable space cell defines a block of cells having a rectangular shape which is coterminous and contiguous with said second rectangular block of cells.

2. A method according to claim 1, wherein:
   said at least one of the expandable space cells includes wire routings having interconnection lines.

3. A method according to claim 2, including the step of specifying the location of at least one of the component cells.

4. An integrated circuit produced by a method comprising the steps of:
   a) providing a set of component circuit cells, each of which has a generally rectangular shape with predefined dimensions;
   b) concatenating the component cells with at least one space cell that is expandable between non-abutting adjacent edges of at least two of the component cells such that the boundary of a concatenated set of component cells and at least one expandable space cell defines a block of cells having a rectangular shape which is coterminous and contiguous with a second block of cells having the same rectangular shape.

5. An integrated circuit produced by a method according to claim 4, wherein;
   said expandable space cells are comprised of white spaces and wire routing spaces including interconnection lines.

6. A method of generating an integrated circuit design layout, comprising the steps of:
   providing at least one component circuit cell having a predefined layout;
   designating at least one instance of the at least one cell in the integrated circuit design layout;
   providing expandable space cells for insertion between adjacent instances of the component cells;
   defining one or more slices, each slice comprised of at least one of said instances of the component cells;
   defining a hierarchy for determining the positions of said instances of said cells in said integrated circuit design layout, including the steps of
   a) resolving the positions of fixed instances of the cells;
   b) resolving the positions of instances of said cells that are dependent on the positions of previously resolved instances; and
   c) defining the dimensions of expandable space cells whereby contiguous slices are dimensionally equal in at least one dimension of width and height.

7. A method according to claim 6, including the step of defining the location of an instance by either fixing the relative position of the instance in said layout, making the position of the instance dependent on the position of another instance, or aligning the instance relative to at least one data port of another instance.

* * * * *